United States Patent [19]

Tada

[11] 4,268,607
[45] May 19, 1981

[54] METHOD OF PATTERNING A RESIST LAYER FOR MANUFACTURE OF A SEMICONDUCTOR ELEMENT

[75] Inventor: Tsukasa Tada, Yokohama, Japan

[73] Assignee: VLSI Technology Research Association, Japan

[21] Appl. No.: 970,253

[22] Filed: Dec. 18, 1978

[30] Foreign Application Priority Data

Dec. 20, 1977 [JP] Japan .............................. 52-153096

[51] Int. Cl.³ .............................................. B05D 3/06
[52] U.S. Cl. ...................................... 430/270; 430/296
[58] Field of Search ........................... 427/43, 44, 54; 96/115 R; 430/270, 296

[56] References Cited

U.S. PATENT DOCUMENTS

| | | | |
|---|---|---|---|
| 4,011,351 | 3/1977 | Gipstein et al. | 427/44 |
| 4,061,829 | 12/1977 | Taylor | 427/43 |
| 4,096,290 | 6/1978 | Fredericks | 427/43 |
| 4,125,672 | 11/1978 | Kakuchi et al. | 427/43 |

FOREIGN PATENT DOCUMENTS

5344441 4/1978 Japan .

OTHER PUBLICATIONS

Roberts "Applied Polymer Symposium" No. 23, pp. 87–98 (1974).

*Primary Examiner*—John H. Newsome
*Attorney, Agent, or Firm*—Finnegan, Henderson, Farabow, Garrett & Dunner

[57] ABSTRACT

A method of patterning a radiation-sensitive resist layer for manufacture of a semiconductor element which uses a radiation-sensitive resist layer formed of at least one of the radiation sensitive materials whose compositions are expressed by any of the following general structural formulas:

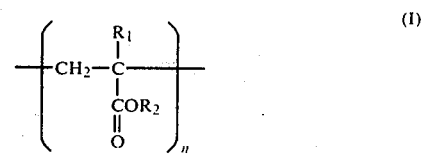

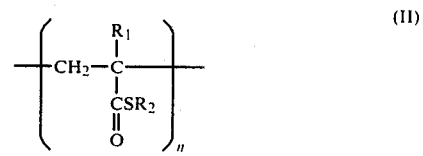

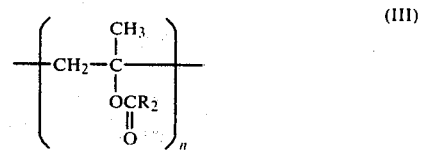

wherein:
$R_1$ = methyl group, halogenated methyl group, cyano group or halogen element
$R_2$ = alkyl group or alkoxy alkyl group having 6 or less carbon atoms in which at least one hydrogen is substituted by chlorine or bromine
$n$ = an integer of 1 or larger, thereby forming an resist pattern with high precision.

5 Claims, No Drawings

METHOD OF PATTERNING A RESIST LAYER FOR MANUFACTURE OF A SEMICONDUCTOR ELEMENT

BACKGROUND OF THE INVENTION

This invention relates to a improved method of patterning a resist layer mounted on a semiconductor substrate or mask substrate.

Photolithography has hitherto been adopted as a method of patterning a resist layer deposited on the above-mentioned type of substrate for use as an etching mask. Particularly in recent years, demand is made to develop a method of producing high resolution structures with high throughput due to the high integration of a semiconductor element. In this respect, attention is paid to radiation lithography utilizing electron beams or X-rays.

The method of patterning a resist layer by radiation lithography comprises the steps of depositing a radiation-sensitive resist layer on a substrate; and emitting radiation on the resist layer to provide a pattern thereon, followed by development. Thereafter, the substrate is provided with a desired pattern by carrying out wet or dry etching with the patterned resist layer used as a mask. Accordingly, a radiation-sensitive resist layer used in radiation lithography should be formed of a material having the following properties:

(1) high sensitivity to radiation
(2) high resolution
(3) high resistance to an etchant, particularly to dry etching
(4) good adhesion to a substrate Various types of radiation-sensitive resist have hitherto been developed to meet the above-mentioned requirements. For example, a resist of the poly(olefin-sulfon) base and a resist of high molecular weight poly(methyl methacrylate) have already been reported as highly sensitive electron positive resists. Though highly sensitive to radiation, the former resist has the drawbacks that it has poor resistance to dry etching due to readiness for decomposition and has poor adhesivity to a substrate, and yet it is difficult to control various conditions for effecting high resolution. Though highly sensitive to radiation and moderately resistant to dry etching. The latter resist has the drawbacks that it is extremely difficult to uniformly coat said resist on the surface of a substrate due to its large molecular weight; a resist layer of uniform thickness can not be easily formed; and said resist more noticeably swells upon contact with a developer than a low molecular weight resist, thereby giving rise to a considerable decline in the patterning precision.

Other types of resist materials proposed to date include a mixture of two or more types of, for example, copolymers of methyl methacrylate and methacryloyl chloride and a single type of such copolymers, all said proposed resist compounds being cross-linked before application.

However, these proposed resist compounds have the following drawbacks:

(1) Since the resist compound consists of a single type or mixed type of the above-mentioned copolymers, it is necessary to precisely control the proportions of monomers constituting said copolymer or the ratio in which two or more types of said copolymer are mixed, because the proportions of the monomers and the ratio of said mixture delicately affect the degree in which a resist layer is cross-linked and consequently the etch-resistance and radiation-sensitivity of the resist layer;

(2) Since the conditions of cross-linking are difficult to control, the proposed resist material-producing process fails to be applied under a stable condition with high reproducibility; and (3) A resist material prepared by the proposed process still has an insufficient radiation sensitivity.

SUMMARY OF THE INVENTION

It is accordingly the object of this invention to provide a method of patterning in the flawless form an easily applicable resist layer of high radiation sensitivity, high resolution and high etch resistance with prominent precision of the submicron order.

The resist layer-patterning method of this invention comprises the steps of applying on the surface of a substrate at least one of radiation-sensitive resist materials whose compositions are expressed by any of the following general structural formulas; thermally effecting the cross-linking of the resist layer to render it insoluble in a solvent; and projecting radiation on the cross-linked resist layer to draw a desired pattern, followed by development.

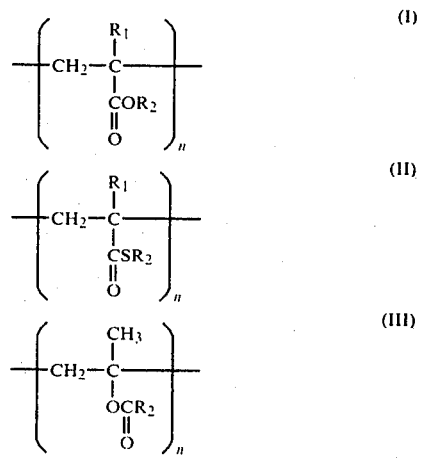

where:
$R_1$ = methyl group, halogenated methyl group, cyano group or halogen element
$R_2$ = alkyl group or alkoxy alkyl group having 6 or less carbon atoms in which one or more hydrogen atoms are substituted by a chlorine or bromine atom
n = an integer of 1 or larger

DETAILED DESCRIPTION OF THE INVENTION

A radiation-sensitive resist material expressed by the general structural formula (I) concretely includes poly(trichloroethyl methacrylate); poly(dichloroethyl methacrylate); poly(dichloropropyl methacrylate); poly(trichloroisopropyl methacrylate); poly(trichloropropyl methacrylate); poly(trichloro t-butyl methacrylate); poly(trichloroisobutyl methacrylate); poly(tetrachlorohexyl methacrylate); poly(2,2,6,6-tetrachlorocyclohexyl methacrylate); poly(1-methoxy-2,2,2-trichloroethyl methacrylate); poly(tribromoethyl methacrylate); poly(tetrabromohexyl methacrylate); poly($\alpha$-cyanotrichloroethyl acrylate); poly($\alpha$-cyanodichloroethyl acrylate); poly($\alpha$-cyano-1-methoxy-2,2,2-trichloroethyl acrylate); poly(α-chloro-trichloroethyl acrylate); poly(α-chloro-trichloroisopropyl) acrylate; poly(α-chloro-1-methoxy-2,2,2-trichloroethyl acrylate); and poly(α-trifluoromethyl trichloroethyl acrylate). Particularly preferred among the above-listed compounds are poly(trichloroethyl methacrylate), poly(1-methoxy-2,2,2-trichloroethyl methacrylate), and poly(α-chloro-trichloroethyl acrylate).

A radiation-sensitive resist material expressed by the general structural formula (II) includes poly(trichloroethyl thiol methacrylate); poly(α-cyanotrichloroethyl thiol acrylate) and poly(α-chloro-trichloroethyl thiol acrylate).

A radio-sensitive resist material expressed by the general structural formula (III) includes poly(isopropenyl trichloroacetate), poly(isopropenyl dichloroacetate), and poly(isopropenyl fluorodichloroacetate.) Particularly preferred among these compounds is poly(isopropenyl trichloroacetate.)

All the above-described radiation-sensitive resist materials may be used alone or in combination. Further, as occasion needs, these radiation-sensitive resist materials used in the method of this invention may be mixed with the prior art radiation-sensitive resist material such as a compound of the poly(olefin-sulfon) base or polymethyl methacrylate.

The radiation-sensitive resist materials of the general structural formulas (I), (II), (III) are desired to have an average molecular weight of about 20,000 to 1,000,000 or more preferably about 100,000 to 800,000 in consideration of readiness for application to a substrate. Accordingly, the radiation-sensitive resist material used in the method of this invention is free from the drawbacks of the prior art high molecular weight resist material of poly(methyl methacrylate) which arise in application to a substrate. Further, the resist material of the invention which is a homopolymer has the advantages that as compared with the prior art resist material of a copolymer, the present resist material can have its quality better controlled and handled with greater ease; the conditions of heating for the undermentioned cross-linking need not be rigidly controlled; and the present resist material can be manufactured under a stable condition with high reproducibility. After dissolved in a proper solvent, the resist material of the invention is coated on s substrate, for example, by the spin coat process, generally to thickness of 0.1 to 2 microns. The thickness of this resist layer is easy to control.

Thereafter the coated resist layer is heated 30 to 90 minutes at a temperature of 160° to 220° C. By this pre-baking process, the resist film coated on a substrate is easily cross-linked by dechlorination or any other reaction due to chlorine atom in the alkyl side chain, thereby converting the resist material into a type insoluble or hardly soluble in a solvent.

A resist layer may be patterned by radiation either by a direct process which can easily control the patterning of the resist layer externally by electron beam scanning or by an indirect process which projects radiation on a resist layer with a desired patterning mask interposed between the resist layer and a source of radiation. Radiation used in the method of this invention includes electromagnetic radiation such as X-rays, γ-rays and deep ultraviolet rays, and corpuscular beam such as electron beams and α-rays. Patterning by radiation disintegrates intermolecular bonding produced by thermal cross-linking in that portion of a resist layer which is bombarded by radiation rendering said portion easily soluble in a solvent. One of the advantages of the method of this invention is that the disintegration of the intermolecular bonding takes place by a very low emission of radiation (at a dosage of 1 to 10 $\mu c/cm^2$ in the case of electron beam exposure).

A solvent and developer for a radiation-sensitive resist material used in the method of this invention may be suitably selected by those skilled in the art. A solvent generally preferred for resist materials of the general structural formulas (I) and (III) is 2-methoxyethyl acetate. A solvent generally preferred for a resist material of the general structural formula (II) is toluene. A generally accepted developer is ethyl cellosolve or dioxane.

A substrate to which the method of this invention can be applied includes the so-called semiconductor substrate for manufacture of a semiconductor element such as a silicon substrate and a substrate formed by mounting a silicon oxide layer or polycrystalline silicon layer on the first mentioned silicon substrate; and the so-called mask substrate formed by depositing a chromium layer or chromium oxide layer on a transparent glass plate.

The method of this invention ensures the high precision paterning of a resist material having high thermal resistance and prominent etch resistance both in wet and dry etching process, thus making it possible to form a high precision etched pattern with the resist material of the invention used as a mask.

With the forgoing embodiment, the radiation-sensitive resist layer was used as the positive type by applying cross-linking in advance. Where necessary, however, the resist layer may be applied as the negative type. In the latter case, high radiation is projected on a radiation-sensitive resist layer. Only those portions of the resist layer which are exposed to radiation are cross-linked. Thereafter, the other portions are removed by development.

This invention will be more fully understood by reference to the examples which follow.

EXAMPLE 1

Poly(2,2,2-trichloroethyl methacrylate) was dissolved in 2-methoxyethyl acetate to prepare a 10% solution of radiation-sensitive resist material. The solution was applied on a rotating silicon wafer, providing a resist layer 0.5 micron thick. The resist layer was heated 60 minutes at 200° C. for cross linking, and rendered insoluble in a solvent. A desired pattern was formed on the resist layer by projecting electron beams having a diameter of 0.1 micron with acceleration voltage of 20 Kv and at a dosage of 2.2 $\mu c/cm^2$, while controlling an electron beam by an electronic computer. Development was made by ethyl cellosolve to selectively eliminate those portions of the resist layer which were bombarded by radiation, thus producing a silicon wafer whose surface was provided with a resist pattern. The resist pattern was formed with as high a precision as less than 1 micron without irregularities. Those portions of the resist layer which were not exposed to radiation did not decrease in thickness.

The resist material of this invention was compared with the prior art resist materials of poly(butene-1-sulfon) (Control 1) and poly(methyl methacrylate) (Control 2). A resist pattern was formed on a silicon wafer from the prior art resist materials of Controls 1 and 2 with the same precision as in the case of Example 1. To this end, the resist layer was formed with the same thickness, and electron beams having the same diameter were applied with the same level of acceleration voltage as in Example 1. In this case, Control 1 required the same dosage of 2.2 μc/cm² as Example 1, whereas Control 2 consumed about 23 times (that is 50 μc/cm²) the dosage of Example 1.

A silicon wafer was etched by argon ion, with patterns of radiation sensitive resist materials of Example 1, and Controls 1, 2 used as a mask each time. Determination was made of the rate at which the patterns of the respective resist materials were etched by argon ion. The pattern of the prior art resist material of polybutene-1-sulfon (Control 1) was etched at the rate of 1,000 Å/min, and the pattern of the prior art resist material of polymethyl methacrylate (Control 2) was etched at the rate of 270 Å/min. In contrast, the pattern of the resist material of Example 1 was etched at the rate of 230 Å/min, proving that the resist material of the invention had etch resistance about 5 times higher than that of Control 1 and about 1.2 times higher than that of Control 2. Therefore, the resist material of the invention provided a high precision etched pattern on a silicon wafer. The above comparison shows that the method of this invention provides a resist material having as high radiation sensitivity and high resolution as that of Control 1 and a higher etch resistance than those of both Control 1 and 2, particularly that of Control 1.

EXAMPLE 2

Poly(1-methoxy-2,2,2-trichloroethyl methacrylate) was dissolved in 2-methoxyethyl acetate to provide a 10% solution of radiation-sensitive resist material. The solution was coated on a rotating silicon wafer to form a resist layer 0.5 micron thick. The resist layer was heated 60 minutes at 200° C. for cross-linking, and rendered insoluble in a solvent. A desired pattern was drawn on the resist layer by emitting electron beams having a diameter of 0.1 micron with acceleration voltage of 20 Kv and at a dosage of 2.0 μc/cm², while controlling the operation of an electronic computer. Development was made by ethyl cellosolve to selectively eliminate those portions of the resist layer which were exposed to electron beams, producing a silicon wafer whose surface was provided with a resist pattern.

The resist pattern on the silicon wafer had the same fineness and precision as in Example 1. The silicon wafer was etched by argon ion as in Example 1 with the resist pattern used as a mask. The pattern of the resist material of this invention was etched at the rate of 230 Å/min, that is, with a very high resistance to an etchant, thus providing a high precision etched pattern on the silicon wafer.

EXAMPLE 3

Poly(2,2,2-trichloroethyl thiol methacrylate) was dissolved in toluene to provide a 10% solution of radiation-sensitive resist material. The solution was applied on a rotating silicon wafer as in Example 1. The resultant resist layer was heated for cross linking and rendered insoluble in a solvent. A desired pattern was drawn on the silicon wafer by projecting electron beams having a diameter of 0.1 micron with an aculeration voltage of 20 Kv and at a dosage of 1.75 μc/cm². Development was made by 1,4-dioxane, producing a silicon wafer whose surface was provided with the resist pattern.

This resist pattern had the same fineness and precision as in Example 1. The silicon wafer was etched by argon ion as in Example 1 with the resist pattern used as a mask. The resist pattern was etched at the rate of 200 Å/min, that is, with a very prominent resisttance to an etchant, thus forming on the silicon wafer an etched pattern having the same precision as the resist pattern.

EXAMPLE 4

Poly(isopropenyl trichloroacetate) was dissolved in 2-methoxyethyl acetate to provide a 10% solution of radiation-sensitive resist material. The solution was coated on a silicon wafer. The coated layer was heated for cross linking and rendered insoluble in solution. Electron beams having a diameter of 0.1 micron were projected on the cross-linked resist layer with an acceleration voltage of 20 Kv and at a dosage of 1.5 μc/cm² to provide a prescribed pattern. Development was made by ethyl cellosolve, producing a silicon wafer whose surface was provided with a resist pattern. The resist pattern on the silicon wafer had the same fineness and precision as in Example 1. The resist pattern was etched by argon ion at the rate of 210 Å/min, that is, with a prominent resistance to an etchant. The etched pattern had substantially as high a precision as the resist pattern.

EXAMPLE 5

Four radiation-sensitive resist solutions prepared from poly(2,2,2-trichloroetchyl methacrylate) (used in Example 1), poly(1-methoxy-2,2,2-trichloroethyl methacrylate) (used in Example 2), poly(2,2,2-trichloroethyl thiol methacrylate) (used in Example 3) and poly(isopropenyl trichloroacetate) (used in Example 4) were respectively applied on rotating four mask substrates formed by mounting a chromium layer on a transparent glass plate, providing radiation sensitive resist layers 0.5 micron thick. The resist layers were heated 60 minutes at 200° C. for cross linking and rendered insoluble in a solvent. Electron beams having a diameter of 0.1 micron were projected on the resist layers with an acceleration voltage of 20 Kv and at a dosage of 2.0 μc/cm² to form a resist pattern on the resist layers. Development was made by developers corresponding to the above-mentioned four resist materials to selectively dissolve those portions of the resist layers which were exposed to radiation, producing four mask substrates whose surface was provided with a resist pattern. The resist pattern formed on each substrate had extreme fineness and high precision without irregularities. Those portion of the resist layer which were not exposed to radiation did not decrease in thickness.

The chromium layer deposited on the transparent glass plate was milled by argon ion applied with an accelration voltage of 500 V and at an irradiation rate of 0.65 m A/cm² under evacuated pressure of $2 \times 10^{-4}$ Torr. Thereafter, the resist pattern was removed by $O_2$ plasma. It was proved in all cases that a chromium pattern was formed with high precision.

EXAMPLE 6

This example relates to the case where a negative resist pattern was formed. A solution of a radiation-sensitive resist material of poly(2,2,2-trichloroethyl methacrylate) was applied on a rotating silicon wafer to form a radiation-sensitive resist layer 0.5 micron thick. The resist layer was prebaked 20 minutes at 140° C. Electron beams were projected on the prebaked resist layer with an acceleration voltage of 20 Kv and at a dosage of 50 μc/cm² to draw a pattern. Development was made by ethyl cellosolve to selectively dissolve those portions of the resist layer which were not exposed to radiation to provide a negative resist pattern on the silicon wafer. This negative resist pattern also had as high a precision as in Example 1.

As mentioned above, this invention provides a method capable of patterning a resist layer highly sensitive to radiation with a high resolution even where weaker radiation is applied than in the prior art method. The resist pattern thus formed has high fineness and precision of the submicron order and improved resistance to an etchant, and consequently proves prominently useful in fabrication of, for example, high density integrated circuits in the micrometer or submicrometer dimensions.

The compounds themselves used in this invention are already known or can be easily prepared by those skilled in the art through the known reaction. However, the method of the invention has applied these compounds for the first time as materials of a radiation-sensitive resist. Therefore, description is omitted of the manufacture of said compounds.

What is claimed is:

1. A method of patterning a radiation-sensitive positive resist layer for manufacture of a semiconductor element which comprises the steps of applying at least one homopolymer of the radiation-sensitive materials having a structural formula selected from the group consisting of:

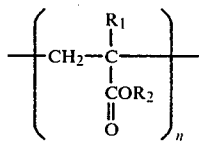
(I)

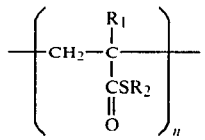
(II)

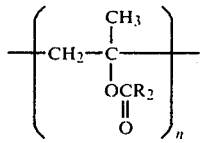
(III)

where:
$R_1$ is a methyl group, a halogenated methyl group, a cyano group or a halogen;
$R_2$ is an alkyl group or an alkoxy alkyl group having 6 or less carbon atoms in which at least one hydrogen is substituted by chlorine or bromine; and
n is an integer of 1 or larger
on a substrate to form a radiation-sensitive resist layer; heating the resist layer to cross-link said radiation-sensitive material and render it insoluble in a solvent; projecting radiation on the cross-linked resist layer to draw a desired pattern; and developing said resist layer to eliminate those portions of the resist layer which were bombarded with radiation.

2. The method according to claim 1, wherein the radiation-sensitive resist material is selected from the group consisting of poly(trichloroethyl methacrylate), poly(1-methoxy-2,2,2-trichloroethyl methacrylate), poly($\alpha$-chloro-trichloroethyl acrylate) and poly(isopropenyl trichloroacetate).

3. The method according to claim 1 or 2, wherein the radiation-sensitive resist material has an average molecular weight ranging between about 100,000 and about 800,000.

4. The method according to claim 1, wherein the radiation-sensitive resist material is cross-linked by heating for 30 to 90 minutes at a temperature ranging from 160° to 220° C.

5. The method according to claim 1, wherein the desired pattern is drawn by irradiating electron beams at a dosage of 1 to 10 $\mu c/cm^2$.

* * * * *